United States Patent [19]
Wolter et al.

[11] Patent Number: 5,116,472
[45] Date of Patent: May 26, 1992

[54] PROCESS FOR COATING SUBSTRATES WITH AN INSULATING COATING

[75] Inventors: Herbert Wolter, Gerchsheim; Helmut Schmidt, Zellingen, both of Fed. Rep. of Germany

[73] Assignee: Fraunhofer-Gesellschaft zur Forderung der Angewandten Forschung E.V., Munich, Fed. Rep. of Germany

[21] Appl. No.: 384,803

[22] Filed: Jul. 25, 1989

[30] Foreign Application Priority Data

Aug. 5, 1988 [DE] Fed. Rep. of Germany ....... 3826715

[51] Int. Cl.$^5$ ............................................. C25D 13/04
[52] U.S. Cl. .................... 204/181.7; 528/32; 522/99; 523/425; 526/279; 524/547; 204/180.6
[58] Field of Search ............... 204/180.6, 181.7; 522/99; 528/32; 523/425; 526/279; 524/547

[56] References Cited

U.S. PATENT DOCUMENTS

| | | | |
|---|---|---|---|
| 4,293,397 | 10/1981 | Sato et al. | 522/99 |
| 4,647,604 | 3/1987 | Kempter et al. | 523/402 |
| 4,911,986 | 5/1990 | Keryk et al. | 528/32 |
| 4,921,926 | 5/1990 | Motegi et al. | 528/32 |
| 4,972,005 | 11/1990 | Aoki et al. | 528/32 |
| 4,987,178 | 1/1991 | Shibata et al. | 524/547 |
| 4,988,788 | 1/1991 | Takarada et al. | 528/32 |
| 5,039,385 | 8/1991 | Tominaga | 204/181.7 |
| 5,069,767 | 12/1991 | Tominaga | 204/181.7 |

*Primary Examiner*—John Niebling
*Assistant Examiner*—Kishor Mayekar
*Attorney, Agent, or Firm*—Oblon, Spivak, McClelland, Maier & Neustadt

[57] ABSTRACT

A process is described for coating electrically conducting substrates with an insulating coating, which comprises first subjecting silicon compounds which both have groups susceptible to hydrolysis and also contain (organic) radicals accessible to a polymerization to a polycondensation, then depositing the resulting polycondensate on the subtrate and curing the coating so obtained by polymerization involving the organic radicals. If the polycondensate additionally contains groups which are capable of carrying a charge, coating by electrophoretic dip coating is possible.

22 Claims, No Drawings

PROCESS FOR COATING SUBSTRATES WITH AN INSULATING COATING

FIELD OF THE INVENTION

The present invention relates to a process for coating electrically conducting substrates, in particular metal cores of printed circuit boards, with an insulating coating and a curable insulating lacquer which can be used in said process.

BACKGROUND OF THE INVENTION

A printed circuit board is a carrier for electronic components and the metallic conductor tracks which connect them. A large proportion of the demand for base materials for such printed circuit boards is met by glass-fiber-reinforced epoxy-resin boards (FR-4). A continuous increase in the packing density of the electronic components and the automation of the insertion impose qualitatively ever greater requirements on the base material.

In this connection, important criteria are:

(a) High thermal conductivity $\lambda$ in order to be able to remove the heat produced by the components rapidly;
(b) High surface and volume resistances, low permittivity $\epsilon$, low loss angle $\tan\delta$, both in a dry and also in a wet atmosphere;
(c) Good thermal and dimensional stability;
(d) Favorable production conditions and good processability;
(e) High chemical stability (towards metallizing chemicals).

Substrate materials based on organic polymers are unable to meet entirely the increasing requirements even in conjunction with metal cores (better heat dissipation); thus, for example, FR-4 boards exhibit the following (relatively unsatisfactory) values: $\lambda=0.16$ W/m×K; Tg=130° C.; $\epsilon=4.5$ and $\tan\delta=23\times10^{-3}$ (at 1 kHz in each case).

As already mentioned above, carrier materials are nowadays required which, inter alia, are able to remove the heat produced by the components rapidly in order to ensure a perfect operation, in particular at high insertion density.

Metallic materials present themselves as ideal heat conductors. Since they are also, in general, excellent electrical conductors, the conductor tracks can be deposited only after the substrate material has been insulated in a suitable manner. Obviously, the insulating coating has to be resistant, particularly in relation to the metallization of the printed circuit board, i.e. it must not be attacked, in particular, by the chemicals which have to be used within the framework of depositing, for example, a copper layer and the later removal of parts of said layer (for example by etching) which are not needed.

OBJECTS AND SUMMARY OF THE INVENTION

The object of the present invention is therefore to provide a process which makes it possible to provide electrically conducting substrates with an insulating coating which is able to meet the abovementioned high requirements for thermal and chemical stability and for the electrical properties.

Accordingly, the present invention relates to a process for coating electrically conducting substrates with an insulating coating, which comprises subjecting one or more silicon compounds A which each contain at least one, in particular two, groups X bound to silicon and susceptible to hydrolysis and/or OH groups, at least one of these compounds additionally having at least one radical Y capable of participating in a (radical or ionic) polymerization reaction, or a corresponding oligomer (precondensate), to a polycondensation, depositing the resulting polycondensate, if necessary after a pre-crosslinking (pre-polymerization) to increase the viscosity, on the substrate and curing the coating so obtained by polymerization (for example purely thermally or in the presence of a UV starter or a thermal radical starter) involving the radicals Y.

In particular, if the polycondensate is to be deposited on the substrate by electrophoretic dip coating, the silicon compounds A also include at least one compound which, in addition to the group(s) X (and if applicable other groups such as, for example, groups Y) contains a radical Z which has a functional group capable of being converted into a positively or negatively charged group, preferably by protonation or deprotonation.

DETAILED DESCRIPTION OF THE INVENTION

In the process according to the invention, electrically conducting substrates are, in particular, metals even though other conducting materials such as, for example, conducting polymers are capable of being coated according to the invention.

Preferred coatable metals are, according to the invention, aluminum, copper, iron, zinc, chromium, nickel, lead, tin, titanium, vanadium and silver, and also the corresponding alloys containing these metals, in particular stainless steels. Particularly preferred are aluminum, copper, iron and iron alloys (stainless steel).

In relation to the groups present in the silicon compounds A, in addition to hydroxyl groups, preferred groups X are hydrogen, halogen, in particular chlorine and bromine, alkoxy, in particular $C_{1-4}$-alkoxy (such as, for example, methoxy, ethoxy, n-, i-propoxy, n-, i-, sec-butoxy), the alkyl radicals optionally being substituted by up to 3 halogens and $C_{1-4}$-alkoxy radicals, acyloxy, in particular $C_{1-4}$-acyloxy (such as, for example, acetoxy and propionyloxy), and $NR'_2$ ($R'=H$ and/or $C_{1-4}$-alkyl).

Preferred groups Y are radicals which have at least one carbon-carbon double or triple bond and examples thereof are vinyl, 1- and 2-propenyl, butenyl, isobutenyl, styryl, (meth)acryloxy-$C_{1-4}$-alkyl, in particular methacryloxypropyl.

Preferred radicals Z have one or more groups $NR'_2$ ($R'=H$ and/or $C_{1-4}$-alkyl) (preferably bound to an aliphatic or aromatic hydrocarbon radical), in particular $-NH_2$, $-N(CH_3)_2$ and $-N(C_2H_5)_2$. The two last-named groups are used, in particular, in those cases where as low a water solubility as possible of the resulting polycondensate is required. Other radicals Z which can be used according to the invention are, for example, $-COOH$ and $-SO_3H$ which, in contrast to the above-mentioned amino groups, may result is a negatively charged polycondensate.

Preferably, the silicon compounds A also include at least one compound which has plasticizing groups V. Said groups serve to impart to the cured coating a certain elasticity which may be necessary to compensate for the different coefficients of thermal expansion of coating and substrate. Preferred groups V are groups containing an aromatic radical, in particular phenyl, tolyl, xylyl and benzyl. Obviously, the phenyl radical may be substituted not only by alkyl groups but also by other groups such as, for example, halogen or nitro. The most preferred group V is, however, the unsubstituted phenyl radical.

In addition to the abovementioned groups X, Y, Z and V, the silicon compounds A optionally also include other radicals R, preferably saturated aliphatic hydrocarbon radicals containing preferably 1 to 8, in particular 1 to 4 carbon atoms such as, for example, methyl, ethyl, n-, i-propyl, n-, i-, sec- and tert-butyl, and cycloaliphatic radicals containing 4 to 8 carbon atoms, in particular cyclopentyl and cyclohexyl. These radicals may optionally also carry substituents, for example halogen or $C_{1-4}$-alkoxy.

Preferably the radicals of the categories just mentioned are present in the silicon compounds A in the following quantities, based on the total number of moles of these groups:

35 to 75 mole percent, preferably 45 to 60 mole percent, and in particular, 50 to 55 mole percent of groups X and/or OH groups;

5 to 30 mole percent, preferably 10 to 20 mole percent, and in particular, 12 to 18 mole percent of groups Y;

0 to 10 mole percent, preferably 0 to 5 mole percent, and in particular, 0 to 3 mole percent of groups Z;

5 to 30 mole percent, preferably 10 to 20 mole percent, and in particular, 12 to 18 mole percent of groups V;

0 to 30 mole percent, preferably 5 to 25 mole percent, and in particular, 10 to 20 mole percent of groups R.

Specific examples of silicon compounds A (mostly commercially available) which may be used to achieve the above conditions are:

(a) γ-methacryloxypropyltrimethoxysilane, vinyltrichlorosilane, methylvinyldichlorosilane, vinyltrimethoxysilane, vinyltriethoxysilane and vinyltris(β-methoxyethoxy)silane; owing to the groups Y present in these compounds, these compounds are of importance, in particular, for organically crosslinking (curing) the insulation lacquer;

(b) Diphenyldichlorosilane, diphenyldimethoxysilane and diphenyldiethoxysilane; owing to the groups V present in these compounds, these compounds are used to impart a certain elasticity to the finished coating;

(c) $SiCl_4$, $Si(OCH_3)_4$, $Si(OC_2H_5)_4$, $Si(n-$ or $i-OC_3H_7)_4$ and $Si(OC_4H_9)_4$; such compounds, which result in three-dimensional linkage points in the polycondensation network after hydrolysis, are preferably used to impart a certain hardness (scratch resistance) to the finished coating;

(d) γ-aminopropyltrimethoxysilane, γ-aminopropyltriethoxysilane, γ-aminopropylmethyldiethoxysilane, N-β-aminoethyl-γ-aminopropyltrimethoxysilane and the corresponding N-mono- or N,N-dimethyl- or -ethylsilanes; owing to the radicals Z present in these compounds, these compounds are used particularly in those cases where the polycondensate is to be deposited on the substrate by electrophoretic dip coating.

Further silicon compounds A which can be used according to the invention and which can be prepared by known methods (cf. W. Noll, "Chemie und Technologie der Silicone", published by Verlag Chemie GmbH, Weinheim/Bergstrasse (1968)), are, for example:

$(CH_3)_2SiCl_2$, $(CH_3)_2Si(OCH_3)_2$, $(CH_3)_2Si(OC_2H_5)_2$
$CH_2=CH-CH_2-Si(OC_2H_5)_3$
$CH_2=CH-CH_2-Si(OOCCH_3)_3$
$(i-C_3H_7)_3SiOH$, $(CH_3)_2Si(OH)_2$
$HSiCl_3$, $Si(OOCCH_3)_4$
$(C_2H_5O)_3SiCH_2-NH_2$
$(C_2H_5O)_3Si-p-C_6H_4-NH_2$
$(CH_3)(CH_3O)_2Si-CH_2-CH(CH_3)-CH_2-NH-(CH_2)_2-NH_2$
$CH_3(C_2H_5O)_2Si-(CH_2)_4-NH_2$
$(CH_3)_2(C_2H_5O)Si-CH_2-NH_2$
$(CH_3)(C_2H_5O)_2Si-CH_2-NH_2$

Preferably, use is made of the compounds of the groups (a) to (d) in the following quantities, based on the total number of moles of the compounds A used:

55 to 75 mole percent, in particular 60 to 70 mole percent, of compounds of the group (a);

24 to 40 mole percent, in particular 29 to 35 mole percent, of compounds of the group (b);

1 to 5 mole percent, in particular 1 to 3 mole percent, of compounds of the group (c);

0 to 10 mole percent, in particular 0 to 7 mole percent, of compounds of the group (d).

Instead of the silicon compounds A or of some of these compounds, corresponding oligomers or precondensates may already also be used in the process according to the invention.

In addition to the silicon compounds A, hydrolytically polycondensible compounds containing central atoms different from silicon may be used. These compounds, however, preferably form less than 40 mole percent, in particular less than 20 mole percent of all the starting compounds used. Preferred examples of central atoms different from silicon are aluminum, titanium, zirconium, vanadium, tin, lead or boron. Suitable compounds containing such central atoms are, in particular, those which have radicals of the categories X, Y, Z, V and R, as they are defined above. Care must, however, be taken that the concomitant use of such compounds different from the compounds A does not noticeably impair the required properties, in particular the chemical and electrical properties, of the resulting insulating coatings.

The polycondensate to be deposited according to the invention on the substrate may be prepared in the manner usual in this field. Thus, for example the starting compounds (in particular the compounds A) may first be dissolved in a suitable (polar) solvent such as, for example, ethanol or isopropanol and this solution may then be brought into contact with at least the stoichiometric quantity theoretically necessary for the hydrolysis, but preferably with an excess, of water at $-20°$ to $130°$ C., preferably between $0°$ C. and the boiling point of the solvent and in particular at room temperature. The best way of bringing into contact depends, inter alia, mainly on the reactivity of the starting compounds used. Thus, for example the dissolved starting compounds may be added dropwise slowly to an excess of water or water is added in one portion or in portions to the dissolved starting compounds. It may also be advantageous not to add the water as such, but to introduce it into the reaction system with the aid of water-containing organic or inorganic systems. In many cases, the introduction of quantities of water into the reaction mixture with the aid of moisture-laden adsorbents, for example molecular sieves, and water-containing organic solvents, for example 80% ethanol, has been found to be particularly suitable. The water may also be added by means of a reaction in which water is formed, for example in the formation of an ester from an acid and alcohol (CCC=Chemically Controlled Condensation).

In addition to the abovementioned, preferably used lower aliphatic alcohols, ketones, preferably low dialkyl ketones such as acetone and methyl isobutyl ketone, ethers, preferably low dialkyl ethers such as diethyl ether, THF, amides such as dimethylformamide, and mixtures thereof are suitable as solvents.

The polycondensation is carried out optionally and preferably with the addition of a catalyst, for example of a compound detaching protons or hydroxyl ions or of an amine. Examples of suitable catalysts are organic or inorganic acids such as hydrochloric acid and acetic acid, organic or inorganic bases such as ammonia, alkali-metal and alkaline-earth-metal hydroxides, for example sodium hydroxide, potassium hydroxide or calcium hydroxide, and water-soluble amines such as triethylamine. Particularly preferred are basic catalysts such as, for example, alkali-metal hydroxides since these result in a very complete condensation, i.e. in a product (polycondensate) which preferably has virtually no (uncondensed) OH groups left. This is advantageous both in relation to the electrical properties and also in relation to the chemical stability of the finished coating since the presence of OH groups facilitates the attack of acids and bases, but also of water, on the coating.

If halosilanes, in particular chlorosilanes, are among the starting compounds A, the addition of water for the polycondensation may possibly be dispensed with completely. In this case it is sufficient if a quantity of base, in particular alkalihydroxide or alkaline earth hydroxide, which is stoichiometric on the basis of the quantity of halogen present is added to the liquid starting compounds. In this case, a slight excess (for example, 1.1 to 1.5 times) of base is preferably used.

The starting compounds A do not necessarily all have to be already present at the start of the polycondensation, but it is sufficient if some of these compounds are first brought into contact with water (or base) and the remaining compounds are added later. It is preferred, however, that all the starting compounds are present at the start of the polycondensation even if these may first react with one another, as may be the case, for example, in the case of the simultaneous presence of chlorosilanes and silanes containing amine groups.

The condensation time depends on the particular starting components and their quantitative proportions, the catalyst used, the reaction temperature etc. In general, the polycondensation is carried out at normal pressure, but it may also be carried out at increased or reduced pressure.

After completion of the polycondensation, the organic constituents possibly present are removed in a suitable manner from the polycondensate. This may be done, for example, by filtering off salts already precipitated, removing the solvent from the filtrate and washing the residue as such or dissolved in a non-polar solvent (for example, petroleum ether) thoroughly with water.

As an alternative to this, a water-insoluble solvent (for example, petroleum ether, boiling range 100° to 140° C.) may be used as solvent for the polycondensation, so that the reaction mixture can be shaken directly with water for the necessary removal of any inorganic salts present (for example alkalihydroxides and alkalihalides).

According to the invention, to ensure satisfactory chemical and electrical properties of the resulting coating, it is very advisable to remove inorganic compounds, water, polar hydrolysis products and any polar solvents used as completely as possible from the polycondensate. After thoroughly washing the polycondensate, it is therefore preferred to dry it and then to expose it to an elevated temperature, for example 120° to 200° C., for a prolonged period of time, for example 0.5 to 4 hours. Drying and heat treatment are preferably carried out in vacuo.

The dried polycondensate thus obtained and thoroughly freed from inorganic materials is possibly not yet sufficiently viscous to provide a satisfactory coating. An excessively low viscosity has, in fact, the result that the lacquer (the polycondensate) tends to run after being deposited on the substrate and before being cured, which may result in a non-uniform coating thickness and is therefore undesirable. According to the invention, it is therefore preferred in most cases to adjust the rheological properties of the polycondensate, in particular its thickness (viscosity) in a manner such that, although the polycondensate still dissolves satisfactorily in the coating solvent generally used, it is so viscous that, once deposited on the substrate, it virtually no longer tends to run. The rheological properties can be adjusted, for example, by a pre-curing (precrosslinking) which is carried out under conditions which result in, for example, some of the groups Y (and possibly, of the groups R) already participating in a polymerization reaction. This can be achieved in a standard manner, for example by exposing the polycondensate to an elevated temperature, preferably a temperature between 200° and 250° C., for a certain time until its viscosity is in the desired range. The viscosity may be monitored by suitable apparatuses well known for this purpose. The most favorable viscosity range may, however, in most cases be determined also purely empirically by interrupting the polymerization (pre-crosslinking) at the instant in time at which the heated polycondensate no longer tends to form drops but pulls threads.

If it is desired to pre-crosslink the polycondensate at low temperatures or even at room temperature, it is advisable to add small quantities of a thermal polymerization catalyst or UV starter and then to initiate the pre-crosslinking by increasing the temperature or by exposure to UV light.

Care must always be taken that the pre-crosslinking does not proceed too far since otherwise a brittle and elastic material is obtained which no longer results in clear solutions. Any small lumps of resin formed during the pre-crosslinking may, however, be removed by filtration, if necessary after dissolving the polycondensate in a suitable solvent.

Before the actual coating operation, the surface of the substrate to be coated is preferably pretreated, in particular cleaned and possibly activated. It is advisable to remove burrs from the edges. If necessary, the surface may be treated with an adhesion promoter (for example, monomeric silanes) before coating. A suitable primer, in particular for aluminum surfaces, is, for example, aminopropyltrimethoxysilane.

According to the invention, the (preferably pre-crosslinked) polycondensate may be deposited on the substrate in any known manner suitable for this purpose, for example by immersion, spraying, spinning, squeegeeing etc. An immersion treatment and, in particular, an electrophoretic dip coating are, however, preferred.

For immersion coating, the polycondensate is advantageously dissolved in a suitable solvent. As a rule, the pre-crosslinked polycondensate dissolves only in non-polar or slightly polar solvents, with the result that aliphatic and aromatic hydrocarbons are particularly well suited for this purpose. Toluene and the xylenes are the most preferred solvents, although other solvents, for example ethyl acetate or butyl acetate may also lead to satisfactory results.

The polycondensate to solvent weight ratio is preferably in the range from 0.5:1 to 2:1, in particular from 0.75:1 to 1.5:1. The optimum ratio in each case depends, inter alia, also on the desired layer thickness. It may also prove advantageous not to achieve the desired layer thickness by a single immersion operation, but to carry out a multiple coating by repeated immersion in the lacquer solution. In this connection, it is advisable to carry out an intermediate curing of the polycondensate before each fresh immersion in order to crosslink it to such an extent that it preferably no longer noticeably dissolves in the lacquer solution during the next immersion operation. An intermediate curing may be carried out, for example, by first allowing the coating to dry in air and then heating it at elevated temperature, for example 200° to 220° C., for a short time, for example 10 to 15 minutes. During the intermediate curing, care should be taken that the polycondensate does not crosslink excessively, which would have the result that the lacquer solution no longer satisfactorily wets the coating already present during the subsequent coating.

After the sole or last immersion operation, a final curing is advantageously carried out, for example, by first allowing the coating to dry in air and then heating it at a temperature in the range from 220° to 270° C. for a prolonged period of time, for example 1 to 2 hours. The conditions optimum for the particular individual case depend, inter alia, on the composition of the polycondensate (starting compounds A) and the treatment of the polycondensate before the actual coating, but they may be determined without difficulty by routine tests.

As for the pre-crosslinking, it is also the case for the intermediate or final curing that temperatures above 200° C. do not necessarily have to be used. Thus, the necessary temperature can be considerably reduced, for example by using a thermal polymerization initiator such as, for example, benzoylperoxide, tert-butyl perbenzoate and azobisisobutyronitrile. If a crosslinking or curing at room temperature is desired, a UV starter may also, for example, be used and the curing may be carried out by irradiation with UV light. Photoinitiators suitable for this purpose are well known in this field. The following are mentioned only by way of example: Irgacure 184 and other photoinitiators of the Irgacure type obtainable from the Ciba Geigy company, Darocur 1173, 1116, 1398, 1174 and 1020 (obtainable from the Merck company), benzophenone, 2-chlorothioxanthone, 2-methylthioxanthone, 2-isopropylthioxanthone, benzoin, 4′,4-dimethoxybenzoin, benzoin ethyl ether, benzoin isopropyl ether, benzyl dimethyl ketal, 1,1,1-trichloroacetophenone, diethoxyacetophenone and dibenzosuberone.

In addition to the thermal initiators explicitly mentioned above, organic peroxides in the form of diacyl peroxides, peroxydicarbonates, alkyl peresters, dialkyl peroxides, perketals, ketone peroxides and alkyl hydroperoxides may quite generally be used.

Obviously, an initiator may also, for example, be used which gives rise to an ionic polymerization.

If an initiator is to be used for the intermediate or final curing, it is advantageously already added to the coating solution.

Although the polycondensate contains, according to the invention, groups Y and R which are capable of bringing about a crosslinking and, consequently, curing of the coating by polymerization, it is, of course, also possible, for example, to add to the coating solution immersion coating compounds which are also accessible to polymerization and thus result in a copolymerization. The properties of the coating may be modified within certain limits in this way. Unsaturated compounds suitable for this purpose are, for example, reactive acrylate and methacrylate monomers such as dipropylene glycol diacrylate, tripropylene glycol diacrylate, trimethylolpropane triacrylate, pentaerythritol tri(tetra)acrylate, ethoxylated bisphenol A dimethacrylate, bis-GMA monomer, urethane dimethacrylate, 1,6-hexanediol dimethacrylate, 1,6-hexanediol diacrylate and corresponding prepolymers.

In addition to the concomitant use of copolymerizable compounds in the lacquer solution, the properties of the insulating coating can also be modified in another way, for example by varying the curing conditions. Thus, it was found, for example, that during thermal curing in an oxygen-containing atmosphere, carbonyl groups form on the surface which may manifest themselves advantageously in relation to the adhesion in the later metallization step.

In addition to the unsaturated monomers mentioned above, the lacquer solution may furthermore contain usual additions such as, for example, fillers, for example mica, glass flakes and quartz particles, pigments, leveling agents and the like. In selecting the type and quantity of the additives, care should be taken that in particular the electrical properties of the desired insulating coating are not noticeably impaired by them.

According to a particularly preferred embodiment of the present invention, the polycondensate is deposited on the substrate by electrophoretic dip coating. Electrophoretic dip coating is suitable, in particular, also for coating irregularly shaped substrates and substrates which contain, for example, drilled holes.

Naturally, it is absolutely necessary for electrophoretic dip coating that the polycondensate contains radicals Z which include in turn functional groups which are capable of carrying a charge. Particularly suitable radicals Z have already been enumerated above. Advantageously, the starting compounds A for producing such a polycondensate contain at least 0.5 mole percent of radicals Z, based on the total number of moles of the groups V, X, Y, Z and R. It can be established quite generally that the number of the chargeable groups should be so large that a satisfactory (rapid) migration takes place in the electric field, but that no more such groups should preferably be present than are absolutely necessary for this purpose.

According to the invention, it is particularly preferred to connect the substrate to be coated as cathode in the electrophoretic dip coating, which has the result that the polycondensate has to contain groups which can be positively charged (by protonation). The following embodiments relate to a deposition of the polycondensate at the cathode, but apply analogously also to a deposition at the anode. In other respects, the comments made in connection with the normal immersion coating in relation to the pre-crosslinking of the polycondensate also apply to electrophoretic dip coating.

Water is typically used as the medium for the electrophoretic dip coating. The cathode comprises the (optionally previously surface-treated) substrate to be coated, for example an aluminum board. As the anode, use may be made of any electrically conducting material which is not attacked under the given conditions. Advantageously, a stainless-steel anode, for example, is used.

Since the (preferably pre-crosslinked) polycondensate is, as a rule, not sufficiently soluble in water despite the presence of the amino groups, it has to be emulsified therein for electrophoretic dip coating. For this purpose, the resin is dissolved, for example, in a suitable (non-polar) solvent, after which this solution is added to the water with vigorous stirring until an emulsion is formed. In order to increase the stability of the emulsion or to make the formation of an emulsion at all possible, it may be advantageous to add a usual emulsifier. Preferably, however, no emulsifier is employed in order that the resulting coating is as free as possible from substances which could impair the electrical and chemical properties of the coating. It has been found that it is possible to produce a stable emulsion even without emulsifier if the resin is dissolved in an aromatic solvent, in particular toluene or xylene. In this case, suitable weight ratios are 90 to 95% water and 5 to 10% polycondensate-solvent mixture. Preferably, the emulsion contains at least 1% solvent. In the event of the polycondensate being pre-crosslinked, the proportion of solvent is preferably at least 2.5%. In principle, the stability of the emulsion increases with an increasing proportion of the organic solvent but, at the same time, if the proportion of solvent is excessively high, the deposited lacquer tends to run.

In order to be able to deposit the polycondensate at the cathode, it has to be positively charged, which is brought about by protonating the amino groups preferably present by adding an acid (either initially to the water or later to the emulsion). For this purpose, all inorganic and organic acids are in principle suitable, such as, for example, hydrochloric acid, perchloric acid, sulfuric acid, nitric acid and phosphoric acid; formic acid, acetic acid, propionic acid and citric acid. According to the invention, phosphoric acid and organic acids are preferred. The quantity of the acid added should preferably only be large enough for all the protonatable groups present to be protonated. In particular, even a slight deficiency of acid is used. Excessively large quantities of acids lead to an increased conductivity of the emulsion, which may have the result that, in addition to the electrochemical deposition of the polycondensate at the cathode, electrolytic processes also occur to a noticeable extent and these are naturally disadvantageous and therefore undesirable. For this reason, the voltage chosen should also not be too high.

The optimum deposition conditions naturally vary with the viscosity of the resin, the substrate, the number of the charged groups present, the desired layer thickness etc. Suitable voltages are normally in the range from 10 to 50, in particular 20 to 40, volts. Stirring is advantageously carried out during electrophoretic dip coating.

After the electrophoretic dip coating, the coated cathode may be freed from any adhering emulsion drops by rinsing it with water, alcohol or another suitable liquid. Any drilled holes present may also be rinsed free in this manner. The next step is, for example, a drying, followed by an intermediate or final curing, such as has already been described above. In this case, too, any thermal initiators or photoinitiators to be used have to be added already to the electrophoretic dip coating solution or emulsion.

The electrophoretic dip coating may be followed, after prior intermediate curing, by a normal immersion coating (possibly also a plurality of immersion coatings) for the purpose of increasing the layer thickness. A second electrophoretic dip coating is not, as a rule, possible since the coating already present has an insulating action and consequently prevents the necessary current flow.

Electrophoretic dip coating is suitable, in particular, for layer thicknesses in the range from $\leq 1$ to 40 $\mu m$.

To summarize, it may be stated that the insulating coatings produced according to the invention are notable for a high chemical and thermal resistance and also yield extremely satisfactory results in relation to their electrical characteristics. Thus, it is possible to produce printed circuit boards provided with an insulating coating according to the invention which meet the requirements imposed on the FR-4 boards conventionally used without difficulty.

The incorporation of chargeable groups into the organically crosslinkable polycondensate furthermore makes it possible to provide the substrate with the insulating lacquer by electrophoretic dip coating, which is advantageous, in particular, in those cases where the substrate is irregularly shaped (many drip edges) or drilled holes.

The following examples illustrate the present invention.

EXAMPLE 1

A suspension composed of 3 liters of ethanol, 376 g of 85% KOH (5.70 mol; the base content of the KOH pellets used was determined titrimetically as approx. 90%) and 25.2 g (0.3 mol) of $NaHCO_3$ was heated to boiling. Then a mixture composed of 275 g (1.95 mol) of methylvinyldichlorosilane, 247 g (0.975 mol) of diphenyldichlorosilane and 15.6 g (0.075 mol) of tetraethoxysilane was slowly added dropwise (approx. 2 to 2.5 hours) while stirring (KPG stirrer) and refluxing. In this process, a bulky white precipitate of KCl or NaCl formed. After completion of the addition of the silanes, heating was continued for a further 2 hours under reflux. After cooling the reaction mixture, the precipitate was separated off by pressure filtration (glass-fiber prefilter plus membrane filter having a pore diameter of 1 $\mu m$) and after-washed with ethanol. The clear-yellow filtrate was then evaporated down in a water-jet vacuum at 60° C.

440 ml of water was added dropwise to the clear yellow residue in the course of approx. ½ hour and then heating was carried out under reflux for approx. 1 hour. After cooling the resulting emulsion, the aqueous phase was separated off by pipetting. Then the operation was repeated. To completely remove still dissolved salts or for the purpose of neutralization, the organic phase was dissolved in approx. 800 ml of petroleum ether (boiling point 40° to 60° C.) and shaken with water until a neutral reaction was obtained. After filtration by means of a hydrophobized filter (removal of suspended water), evaporation was carried out using a rotary evaporator. The viscous colorless residue was then baked at 150° C. for approx. 1 hour and at 180° C. for 2 hours in a water-jet vacuum. The colorless to bright-yellow base resin (approx. 320 g) thus obtained was pre-crosslinked at 200° C. for approx. 2 hours while stirring (KPG stirrer, open flask).

The pre-crosslinked resin was heated under reflux in approx. 160 g of toluene for 1 hour, treated for 10 minutes with an IKA Ultra Turrax stirrer and pressure-filtered (glass-fiber prefilter plus membrane filter having a pore width of 0.6 or 0.2 μm). The resulting clear solution was adjusted to the desired viscosity range by adding toluene.

An aluminum substrate was coated with the above coating lacquer by immersion coating under the following conditions:
  Solvent content of lacquer: approx. 55 percent by weight of toluene (viscosity approx. 200 cSt)
  Number of coatings: 2;
  Pulling speed: 3 cm/min;
  Intermediate curing (after the first coating): 1. Drying in air; 2. Heating at 220° to 200° C. for 10–15 minutes;
  Final curing: 1. Drying in air; 2. Heating at 200° C. for 10 minutes; 3. Heating at 240° C. for 1 hour.

The coating so obtained had a layer thickness of approx. 45 μm. The coating was colorless and smooth and exhibited no visible alterations in the condensed-water test (4 days at 100% atmospheric humidity and a temperature of 40° C.) and in the chemical resistance test (10 minutes in 5% aqueous sodium hydroxide solution at 50° C. and also 10 minutes in 5% aqueous sulfuric acid at 50° C., and in the solder test (10 seconds in liquid tin at 260° C.).

The electrical properties of the coating obtained are compared with those for FR-4 boards in the table below.

EXAMPLE 2

A suspension composed of 3 liters of ethanol, 357 g of 85% KOH (5.41 mol) and 23.9 g (0.28 mol) of $NaHCO_3$ was heated to boiling. Then a mixture composed of 265 g (1.875 mol) of methylvinyldichlorosilane, 228 g (0.900 mol) of diphenyldichlorosilane and 15.6 g (0.075 mol) of tetraethoxysilane was slowly added dropwise (in the course of 2.5 hours) while stirring (KPG stirrer) and while refluxing. In this process, a bulky white precipitate of KCl or NaCl formed. After completion of the addition of the silanes, heating was continued for a further 2 hours under reflux and then cooling was carried out for 15 minutes in an ice bath. After adding 33.2 g (0.15 mol) of γ-aminopropyltriethoxysilane dropwise while stirring in the course of 15 minutes (ice bath), the reaction mixture was reheated, heated for 1 hour under reflux and then stirred at room temperature for approx. 17 hours. Then the precipitate was separated off by pressure filtration (glass-fiber prefilter plus membrane filter having a pore diameter of 1 μm) and after-washed with 400 ml of ethanol. The clear filtrate was evaporated down at approx. 80° C. in a water-jet vacuum (40 mbar). 450 ml of water was added to the clear, still hot residue, after which the mixture was heated for 1 hour under reflux. After the organic phase had separated off (30 minutes, temperature approx. 60° to 70° C.), the aqueous phase was separated off by pipetting. Then this operation was repeated. Finally, the organic phase was dissolved in approx. 1.4 liters of petroleum ether (boiling point 50° to 70° C.) and the solution shaken with water (4 times 200 ml in each case) to completely remove still dissolved salts or for the purpose of neutralization until a neutral reaction was obtained.

After filtration by means of a hydrophobized filter (removal of suspended water), the washed petroleum ether solution was evaporated down using a rotary evaporator. The viscous residue was heated at 150° C. for approx. 1 hour and at 180° C. for 2 hours in a water-jet vacuum, as a result of which approx. 335 g of a colorless to bright-yellow base resin was obtained.

The base resin so obtained was pre-crosslinked at 215° C. for approx. 1 hour while stirring (KPG stirrer) with an open flask with a stream of argon being passed across. The very viscous resin was then dissolved in approx. 240 g of toluene using an IKA Ultra Turrax stirrer in the course of 10 minutes. The solution which was clear after pressure filtration (glass-fiber prefilter plus membrane filter having a pore size of 1 μm) was adjusted to the desired viscosity range by adding toluene.

The lacquer solution so obtained was used for an immersion coating as described in Example 1 under the following conditions:
  Polycondensate to toluene weight ratio: approx. 1:0.77 (viscosity approx. 134 cSt);
  Number of coatings: 2;
  Pulling speed: 3 cm/min;
  Intermediate curing (after the first coating): 1. Drying in air; 2. Heating at 200° C. for 15 minutes;
  Final curing: 1. Drying in air; 2. Heating at 200° C. for 10 minutes; 3. Heating at 270° C. for 1 hour (in air).

The coatings obtained had the following properties:
  Layer thickness: 30 to 40 μm;
  Appearance: golden-yellow, very smooth surface; breakdown strength: 3 kV;
  No relevant alterations in the condensed-water test, chemical resistance test and solder test.

The electrical properties of an analogous coating which was obtained using butyl acetate as solvent under the following conditions are specified in the accompanying table:
  Polycondensate to n-butyl acetate weight ratio: approx. 1:0.84 (viscosity of the coating solution approx. 135 cSt);
  Number of coatings: 2;
  Pulling speed: 3 cm/min;
  Intermediate curing (after the first coating): 1. Drying in air; 2. Heating at 200° C. for 15 minutes;
  Final curing: 1. Drying in air; 2. Heating at 200° C. for 10 minutes; 3. Heating at 270° C. for 1 hour (in air);
  Layer thickness: approx. 38 μm.

In a further mixture, 6% (based on the polycondensate) of Irgacure 184 was added to the above lacquer solution before immersion coating. Then a normal immersion coating was carried out. The emersed substrate was heated at 50° C. for 10 minutes to remove the solvent, which was followed by a UV curing of the lacquer by irradiation for 2 minutes with an Hg medium-pressure emitter (1000 W).

EXAMPLE 3

An electrophoretic dip coating was carried out using a polycondensate prepared as in Example 2 and containing amine groups (amine content 0.371 mmol per g of resin) under the following conditions:

Production of an emulsion composed of 92.5 parts by weight of water (including phosphoric acid), 5 parts by weight of pre-crosslinked resin and 2.5 parts by weight toluene.
Start of the electrophoretic dip coating: 1.5 hours after production of the emulsion;
Voltage: 30 V
Deposition time: 1 minute;
Rotary speed of stirrer: 200 rev/min;
Temperature: 25° C.;
Electrode material: Aluminum (cathode) and stainless
steel (anode) respectively;
Electrode spacing: approx. 1.2 cm;

After the electrophoretic dip coating, the cathode was rinsed with ethanol and cured (10 min at 200° C. and 1 h at 270° C.).

Layer thickness: approx. 10 μm (very uniform).

To increase the layer thickness, the substrate so obtained may be subjected to a standard immersion coating.

After the electrophoretic dip coating, the cathode was rinsed with $H_2O$ and cured (10 min at 200° C. and 1 h at 270° C.). Layer thickness for 30 V (1 min) to 40 V (2 min): approx. 13 μm to 28 μm.

Breakdown strength: from 20 μm upwards $\geq$ 1 kV.

We claim:

1. A process for electrophoretically coating electrically conducting substrates with an insulating coating, which comprises subjecting at least two silanes which each contain at least one hydrolyzable group and/or an OH group, bound to silicon, at least one of these silanes additionally having at least one radical capable of participating in a radical or ionic polymerization reaction, and at least one of these silanes additionally having at least one radical which has a functional group capable of being converted into a charged group, or a corresponding oligomer, to a polycondensation reaction, depositing the resulting polycondensate substantially free of OH groups on the substrate and curing the coating so obtained by polymerization involving the radicals capable of participating in the radical or ionic polymerization.

2. The process as claimed in claim 1, wherein said radical which has a functional group capable of being converted into a charged group contains an amino group, monoalkylamino group or dialkylamino group.

3. The process as claimed in claim 1, wherein the

TABLE

| | Electrical properties of the coatings produced | | | | |
|---|---|---|---|---|---|
| | Required values for FR-4 | Coating of Example 1 | | Coating of Example 2 | |
| | (glass-fiber-reinforced epoxy-resin boards) | Dry atmosphere[1] | Moist atmosphere[2] | Dry atmosphere[1] | Moist atmosphere[2] |
| Surface resistance $R_O$ (Ω) | >10$^{10}$ | >10$^{14}$ | 4.4 · 10$^{12}$ | 4.2 · 10$^{13}$ | 5.5 · 10$^{12}$ |
| Specific volume resistance $\rho_D$ (Ω · cm) | >10$^{11}$ | 4.5 · 10$^{16}$ | 6.8 · 10$^{15}$ | 7.6 · 10$^{15}$ | 3.1 · 10$^{15}$ |
| Breakdown field strength $E_D$ (V/cm) | 3 · 10$^5$ | 8.7 · 10$^5$ | n. b. | 8.5 · 10$^5$ | n. b. |
| Permittivity $\epsilon_R$ (at 1 kHz) | 5.5 | 3.23 | 3.45 | 2.85 | 2.71 |
| Loss angle tan δ (at 1 kHz) | <35 · 10$^{-3}$ | 3.97 · 10$^{-3}$ | 7.6 · 10$^{-3}$ | 7.7 · 10$^{-3}$ | 9.6 · 10$^{-3}$ |

[1]Dry atmosphere: 50% relative atmospheric humidity and 23° C. (4 days)
[2]Moist atmosphere: 92% relative atmospheric humidity and 40° C. (4 days)

EXAMPLE 4

An electrophoretic dip coating was carried out using a polycondensate prepared as in Example 2 and containing amine groups (amine content 0.249 mmol per g of resin) under the following conditions:

| Emulsion composition | $H_2O$: | pre-crosslinked | |
|---|---|---|---|
| | | resin: | xylene |
| | 94.4: | 4.7: | 0.9 |
| | | (in parts by mass) | |

Acid: ¼ equiv. $CH_3CO_2H$ (based on the amine conent);
Voltage: 30–40 V;
Rotary speed of stirrer: 200 rev/min;
Temperature: 25° C.;

| Electrode material | Aluminum (cathode), Stainless steel (anode); |
|---|---|

Electrode spacing: 1.2 cm.

substrate is coated with the polycondensate by immersion in a solution of the latter.

4. The process as claimed in claim 2, wherein the polycondensate is deposited on the substrate by electrophoretic dip coating.

5. The process as claimed in claim 1, wherein the electrically conducting substrate is a metal.

6. The process as claimed in claim 1, wherein the polymerization is carried out as a free radical polymerization.

7. The process as claimed in claim 1 wherein the hydrolyzable groups are selected from halogen, $C_{1-4}$-alkoxy and $C_{1-4}$-acyloxy.

8. The process as claimed in claim 1, wherein the radicals capable of participating in a radical or ionic polymerization are selected from vinyl and γ-methacryloxypropyl radicals.

9. The process as claimed in claim 1, wherein the radicals having a functional group capable of being converted into a charged group are selected from γ-aminopropyl, N-β-aminoethyl-γ-aminopropyl and the corresponding N-methyl(ethyl)- and N,N-dimethyl(diethyl)-substituted radicals.

10. The process as claimed in claim 1, wherein the silanes additionally contain plasticizing groups.

11. The process as claimed in claim 1, wherein the silanes include at least one silane which contains three or four hydrolyzable groups or OH groups bound to silicon.

12. Substrates provided with an insulating coating prepared by the process as claimed in claim 1.

13. The process according to claim 1 wherein the silanes are subjected to an alkaline polycondensation, and the silanes contain the following groups and radicals in the following quantities, based on the total number of moles of these groups and radicals:
   (a) 35 to 75 mole percent of a hydrolyzable and/or OH group;
   (b) 5 to 30 mole percent of a radical capable of participating in a radical or ionic polymerization;
   (c) 0.5 to 10 mole percent of a radical having a functional group capable of being converted into a charged group;
   (d) 5 to 30 mole percent of a plasticizing group; and
   (e) 0 to 30 mole percent of a saturated aliphatic hydrocarbon group.

14. The process according to claim 1, wherein the silanes are subjected to polycondensation in the presence of alkali and are the following silanes in the following amounts;
   (a) 55 to 75 mole percent, based on the total number of moles of the silanes, of at least one compound which is selected from γ-methacryloxypropyltrimethoxysilane, vinyltrichlorosilane, methylvinyldichlorosilane, vinyltrimethoxysilane, vinyltriethoxysilane and vinyltris(β-methoxyethoxy)silane;
   (b) 24 to 40 mole percent, based on the total number of moles of the silanes, of at least one compound which is selected from diphenyldichlorosilane, diphenyldimethoxysilane and diphenyldiethoxysilane;
   (c) 1 to 5 mole percent, based on the total number of moles of the silanes, of at least one compound which is selected from tetrachlorosilane, tetramethoxysilane, tetraethoxysilane, tetra(i-propoxy)silane, tetra(n-propoxy)silane and tetrabutuoxysilane;
   (d) 0.5 to 10 mole percent, based on the total number of moles of the silanes, of at least one compound which is selected from γ-aminopropyltrimethoxysilane, γ-aminopropyltriethoxysilane, γ-aminopropylmethyldiethoxysilane and N-β-aminoethyl-γ-aminopropyltrimethoxysilane and the corresponding N-mono- or N,N-di-methyl- or -ethylsilanes.

15. The process as claimed in claim 5, wherein the electrically conducting substrate is aluminum, copper, iron or alloys thereof.

16. The process as claimed in claim 6, wherein the free radical polymerization is carried out using UV light.

17. The process as claimed in claim 7, wherein the hydrolyzable groups are chlorine.

18. The process as claimed in claim 10, wherein the plasticizing group is phenyl.

19. The process as claimed in claim 11, wherein the silanes includes at least silane which contains four hydrolyzable groups or OH groups bound to silicon.

20. The process as claimed in claim 13, wherein the silanes contain the following groups and radicals in the following quantities, based on the total number of moles of these groups and radicals:
   (a) 45 to 60 mole percent of a hydrolyzable group and/or OH;
   (b) 10 to 20 mole percent of a radical capable of participating in a radical or ionic polymerization;
   (c) 0.5 to 5 mole percent of a radical having a functional group capable of being converted into a charged group;
   (d) 10 to 20 mole percent of a plasticizing group; and
   (e) 5 to 25 mole percent of a saturated aliphatic group.

21. The process according to claim 13, wherein the saturated aliphatic group contains 1 to 8 carbon atoms.

22. The process according to claim 20, wherein the saturated aliphatic group contains 1 to 8 carbon atoms.

* * * * *